(12) United States Patent
Qin et al.

(10) Patent No.: US 10,312,183 B2
(45) Date of Patent: Jun. 4, 2019

(54) DIE PACKAGE COMPONENT WITH JUMPER STRUCTURE

(71) Applicant: TAIWAN SEMICONDUCTOR CO., LTD., New Taipei (TW)

(72) Inventors: Reyn Qin, New Taipei (TW); Lucy Fan, New Taipei (TW); Meifang Song, New Taipei (TW); Xiaoli Wang, New Taipei (TW)

(73) Assignee: TAIWAN SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 15/644,202

(22) Filed: Jul. 7, 2017

(65) Prior Publication Data
US 2018/0331021 A1    Nov. 15, 2018

(30) Foreign Application Priority Data
May 9, 2017    (TW) .............................. 106115342 A

(51) Int. Cl.
*H01L 23/495* (2006.01)
*H01L 21/48* (2006.01)
(Continued)

(52) U.S. Cl.
CPC .... *H01L 23/49517* (2013.01); *H01L 21/4825* (2013.01); *H01L 21/4842* (2013.01); *H01L 21/561* (2013.01); *H01L 23/13* (2013.01); *H01L 23/3114* (2013.01); *H01L 23/49513* (2013.01); *H01L 23/49524* (2013.01); *H01L 23/49537* (2013.01); *H01L 23/49541* (2013.01); *H01L 23/49562* (2013.01); *H01L 24/32* (2013.01); *H01L 24/37* (2013.01); *H01L 24/40* (2013.01); *H01L 24/84* (2013.01); *H01L 24/92* (2013.01); *H01L 24/97* (2013.01); *H01L 23/49551* (2013.01); *H01L 24/29* (2013.01); *H01L 24/33* (2013.01); *H01L 24/83* (2013.01); *H01L 2224/291* (2013.01); *H01L 2224/32058* (2013.01); *H01L 2224/32245* (2013.01); *H01L 2224/33181* (2013.01); *H01L 2224/3701* (2013.01); *H01L 2224/37012* (2013.01);
(Continued)

(58) Field of Classification Search
CPC . H01L 2224/48091; H01L 2224/48247; H01L 24/90; H01L 23/49544
See application file for complete search history.

(56) References Cited

U.S. PATENT DOCUMENTS 4,994,412 A * 2/1991 Kalfus .............. H01L 23/49537
                                                    257/E23.042

* cited by examiner

*Primary Examiner* — Quoc D Hoang
(74) *Attorney, Agent, or Firm* — Muncy, Geissler, Olds & Lowe, P.C.

(57) ABSTRACT

A die package component with a jumper structure includes a first lead frame, a second lead frame, a die, a jumper structure and a package body. The first lead frame has a die connection surface. The second lead frame is separated to the first lead frame. The second lead frame has a lead frame connection groove which defines a thermal deformation tolerance allowable route. The jumper structure is thermally deformed in a thermal-variable environment. The jumper structure includes a die welding portion and a lead welding portion. The die welding portion is welded to the die. Upon meeting a thermal deformation, the lead welding portion would be movable welded along the thermal deformation tolerance allowable route to the lead frame connection groove.

5 Claims, 9 Drawing Sheets

(51) Int. Cl.
*H01L 23/00* (2006.01)
*H01L 21/56* (2006.01)
*H01L 23/13* (2006.01)
*H01L 23/31* (2006.01)

(52) U.S. Cl.
CPC ............... *H01L 2224/40245* (2013.01); *H01L 2224/40499* (2013.01); *H01L 2224/73263* (2013.01); *H01L 2224/83907* (2013.01); *H01L 2224/84345* (2013.01); *H01L 2224/84385* (2013.01); *H01L 2224/9221* (2013.01); *H01L 2224/97* (2013.01); *H01L 2924/181* (2013.01)

DIE PACKAGE COMPONENT WITH JUMPER STRUCTURE

BACKGROUND OF THE INVENTION

1. Field of the Invention

The invention relates to a die package component and a manufacturing method thereof, and more particularly to the die package component and the manufacturing method of the die package component that includes a jumper structure to connect a lead frame connection groove configured a thermal deformation tolerance allowable route.

2. Description of the Prior Art

For decades, development in semiconductor technology has thoroughly improved people's lives. Semiconductor products have been liberally adopted into various electronic devices and information technology. Actually, progress in semiconductor techniques has significantly boosted the development of modern technology. Even so, improvements on versatile semiconductor structures and manufacturing methods are still emerged. In particular, since the majority of semiconductor dies are structurally complicated and precise scaled, a package body is usually needed to protect and thus ensure wiring and structuring of the semiconductor die.

Referring now to FIG. 1 through FIG. 3; where FIG. 1 is a schematic view of a first frame assembly and a second frame assembly in the art, FIG. 2 is a schematic enlarged view of area A of FIG. 1, and FIG. 3 is a schematic cross-sectional view of FIG. 2 along line B-B. As shown, the first frame assembly PA1 is provided to include a plurality of first frames PA11 intermittently arranged, while the second frame assembly PA2 is provided to include a plurality of second frames PA21 intermittently arranged as well.

The first frame PA11 includes a die-mounting portion PA111 and a first-frame lead portion PA112 extended from the die-mounting portion PA11. The second frame PA21 includes a die welding portion PA211 having a bump structure PA2111 and a second-frame lead portion PA212 extended from the die welding portion PA211.

Referred to FIG. 4, a schematic view of a die mounted by the first frame and the second frame of FIG. 3 is shown. In the art, a plurality of dies are to be mounted by the first frame assembly PA1 and the second frame assembly PA2. During the mounting, the first frame assembly PA1 and the second frame assembly PA2 are manually moved to a specific mounting area on a graphite welding plate by suckers or vacuum nozzles. Then, a plurality of dies PA3 would be arranged at predetermined positions between the first frame assembly PA1 and the corresponding second frame assembly PA2.

Each of the dies PA3 is welded onto the corresponding die-mounting portion PA111 by a solder PAW1, and a bump structure PA2111 of the corresponding die welding portion PA211 is further welded to the same die PA3 by another solder PAW2, such that an electrical coupling route connection the first frame PA111, the die PA3 and the second frame PA21 is thus established.

Then, the combination of the first frame assembly PA1, the second frame assembly PA2 and the dies PA3a would be sent into a reflow oven for heating and melting the solders PAW1, PAW2 into a liquid state. The liquid-stated solder PAW1 would be evenly distributed between the die-mounting portion PA111 and the die PA3, while the liquid-stated solder PAW2 is evenly distributed between the bump structure PA2111 and the die PA3.

Referring to FIG. 5, a conventional die package structure for FIG. 4 is schematically shown. By having the solders PAW1, PAW2 to weld the first frame assembly PA1 and the second frame assembly PA2 to opposing sides of the die PA3, a package body PA4 would be formed to package and thus protect each set of the first frame PA11, the second frame PA21 and the die PA3 into a unique piece.

Then, after the package of the first frame PA1, the second frame PA21, the die PA3 and the package body PA4 is cooled down, the first frame PA11 is separated from the first frame assembly PA1, and the second frame PA21 is separated from the second frame assembly PA2; such that a die package structure PA100 is thus formed.

Since the first frame assembly PA1 and the second frame assembly PA2 are fixed on the graphite welding plate while in locating and welding the dies PA3, thus as the first frame assembly PA1, the second frame assembly PA2 and the dies PA3 are heated, the first frame assembly PA1 and the second frame assembly PA2 would be thermally expanded to bias the positions of the corresponding dies PA3 to some extent.

After the package body PA4 wrapping the first frame PA11, the second frame PA21 and the dies PA3 is cooled down, the first frame assembly PA and the second frame assembly PA2 would be shrunk back to the original dimensions, and thereby the die PA3 inside the package body PA4 would be stressed by the shearing induced by the shrinking of the first frame assembly PA1 and the second frame assembly PA2. Practically, such induced shearing would somehow damage the die PA3 and the die package structure PA100 as well. Hence, through the aforesaid manufacturing method to produce the die package structure PA100, an obvious disadvantage thereof is that the yield of the die package structure PA100 would be low, and, from which, additional production cost would be inevitable to the manufacturers.

SUMMARY OF THE INVENTION

In view of the aforesaid art, the die would be affected to displace and/or rotate, or evenly damaged, by the shearing induced by cold contraction of the first frame assembly and the second frame assembly. Hence, a low production yield of the die package structure is inevitable.

Accordingly, it is an object of the present invention to provide a die package component with a jumper structure. The die package component of the present invention includes a first lead frame, a second lead frame, a die, a jumper structure and a package body. The first lead frame has a die connection surface. The second lead frame separated to the first lead frame is furnished with a lead frame connection groove further including a thermal deformation tolerance allowable route. The die is connected on the die connection surface.

The jumper structure welds the die and the lead frame connection groove so as to establish an electric connection between the die and the lead frame connection groove. At least part of the jumper structure is located in the thermal deformation tolerance allowable route. The package body packages at least partly the first lead frame and the second lead frame, but completely the die and the jumper structure. While being stressed by a stress, especially by a thermal stress generated under a thermal-variable environment for executing many different manufacturing processes, the jumper structure is movable along the thermal deformation tolerance allowable route of the lead frame connection groove.

In one embodiment of the present invention, the second lead frame includes a guide-stop structure at one side at least on a vertical route of the lead frame connection groove, the vertical route being perpendicular to the extension direction, the guide-stop structure being to guide the lead welding portion into the lead frame connection groove and to prevent the lead welding portion from leaving the lead frame connection groove along the vertical route.

In one embodiment of the present invention, the lead frame connection groove is a trapezoidal groove.

In one embodiment of the present invention, the jumper structure includes a die welding portion and a lead welding portion. The die welding portion has a bump structure protruding toward the die, and a solder accommodation space is formed between the bump structure and the die. The lead welding portion extends as a unique piece from the die welding portion in an extension direction parallel to the thermal deformation tolerance allowable route. The lead welding portion is welded to connect the lead frame connection groove, so that the jumper structure can bridge electrically the die and lead frame connection groove.

In another aspect of the present invention, the method for manufacturing a die package component with a jumper structure includes the following steps. Firstly, a lead frame assembly is formed to have a plurality of lead frame components as a unique piece by being intermittently arranged into an array distribution. Each of the lead frame components includes a first lead frame having a die connection surface and a second lead frame separated to the first lead frame, in which the second lead frame further includes a lead frame connection groove having a thermal deformation tolerance allowable route. Then, a plurality of dies are connected individually to the respective die connection surfaces of the corresponding lead frame components.

Then, a plurality of jumper structures are welded individually to the corresponding dies and the corresponding lead frame connection grooves of the respective lead frame components so as to establish respective electric connections between the dies and the corresponding lead frame connection grooves of the respective lead frame components. In addition, at least part of the jumper structure is located in the thermal deformation tolerance allowable route.

Then, a package body is formed to package at least partly the first lead frame and the second lead frame of the lead frame component and to completely package the die and the jumper structure. Finally, the first lead frame and the second lead frame of the lead frame component are separated from the lead frame assembly so as to form the die package component with the jumper structure. In the present invention, upon being stressed by a stress, especially by a thermal stress generated under a thermal-variable environment for executing many different manufacturing processes, the jumper structure is movable along the thermal deformation tolerance allowable route of the lead frame connection groove.

In one embodiment of the present invention, the jumper structure is extended at least partly in an extension direction parallel to the thermal deformation tolerance allowable route. While in forming the lead frame assembly having a plurality of lead frame components as a unique piece by being intermittently arranged into an array distribution, a guide-stop structure is formed at one side at least on a vertical route of the lead frame connection groove. The vertical route is perpendicular to the extension direction, and the guide-stop structure is to guide the lead welding portion into the lead frame connection groove and to prevent the lead welding portion from leaving the lead frame connection groove along the vertical route.

In one embodiment of the present invention, prior to welding individually a plurality of jumper structures to the corresponding dies and the corresponding lead frame connection grooves of the respective lead frame components, the jumper assembly having the plurality of jumper structures as a unique piece by being intermittently arranged into another array distribution is formed in advance. Then, the plurality of jumper structures are separated from the jumper assembly.

In one embodiment of the present invention, the lead frame connection groove is a trapezoidal groove.

As stated above, by providing the die package component with a jumper structure and a manufacturing method thereof in accordance with the present invention, while the jumper structure is stressed, the jumper structure would be displaced within the thermal deformation tolerance allowable route of the lead frame connection groove, such that the die would be relieved from the thermal stress caused by the thermal expansion of the jumper structure.

In comparison with the prior art, by providing the die package component with a jumper structure and a manufacturing method thereof in accordance with the present invention, while in heating or cooling, the jumper structure would displace along the thermal deformation tolerance allowable route in the lead frame connection groove, such that the thermal stress applied to the die would be substantially relieved. Namely, potential bias, rotation or damage upon the die caused by the induced thermal stress can be effectively inhibited.

All these objects are achieved by the die package component with a jumper structure and the manufacturing method thereof described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a die package component with a jumper structure and a manufacturing method thereof. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
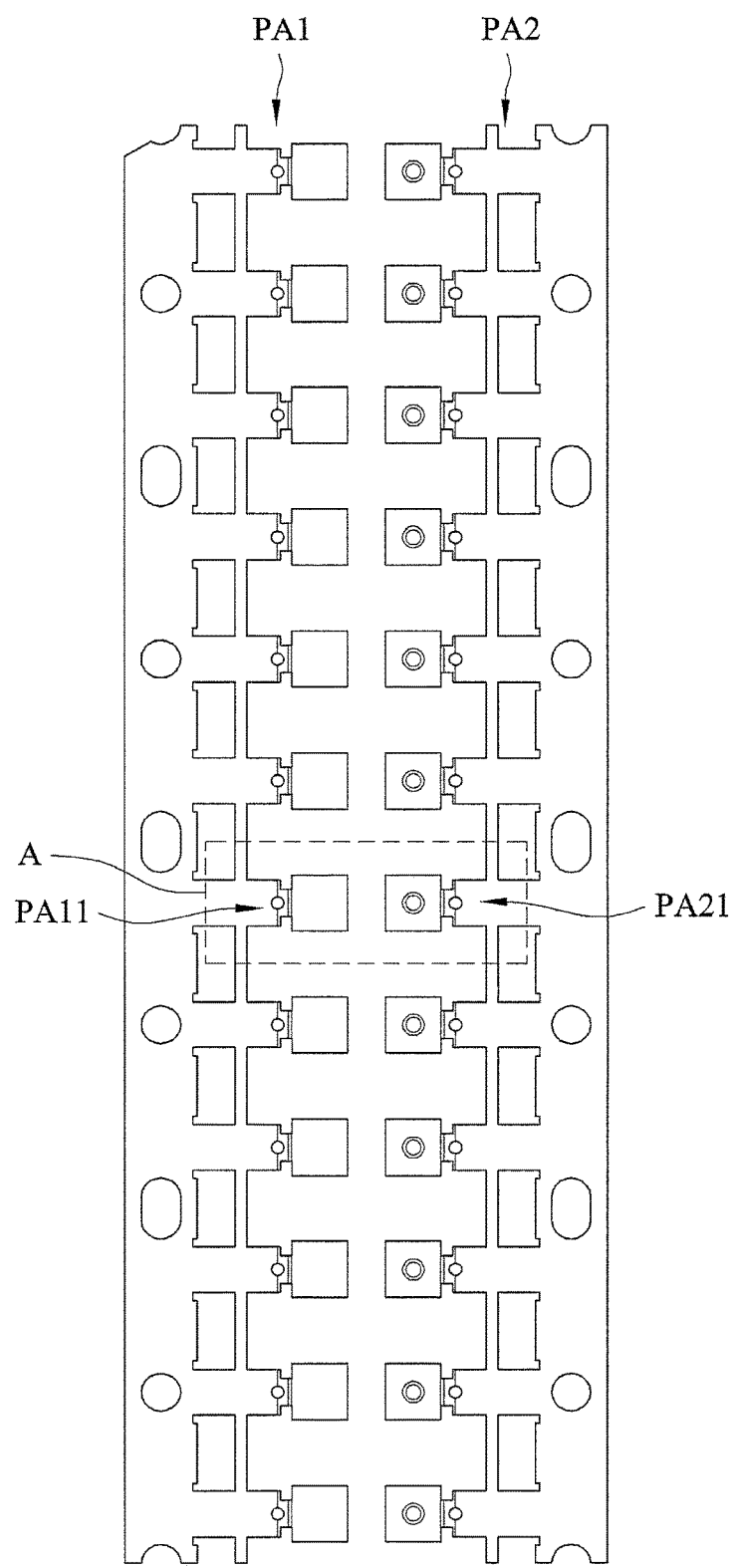
FIG. 1 is a schematic view of a first frame assembly and a second frame assembly in the art.
Figure 2:
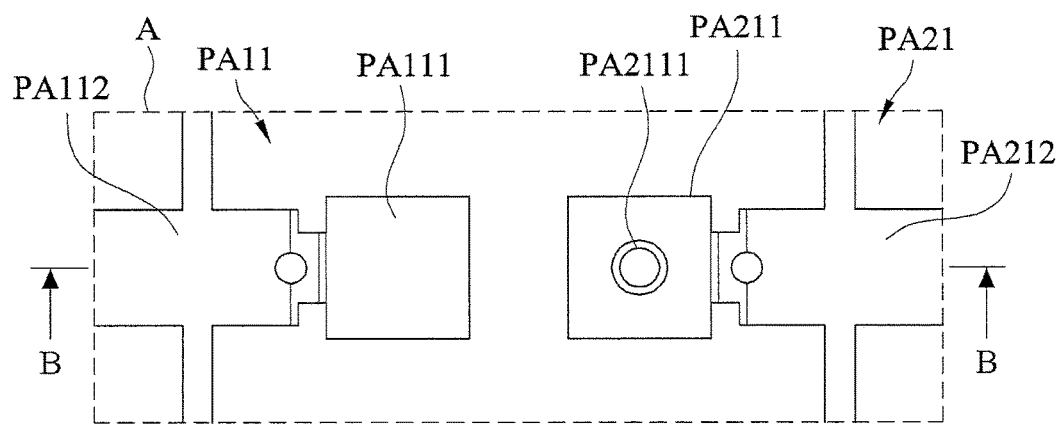
FIG. 2 is a schematic enlarged view of area A of FIG. 1.
Figure 3:
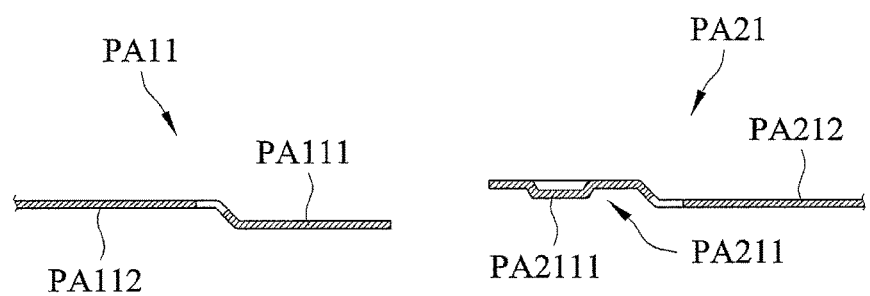
FIG. 3 is a schematic cross-sectional view of FIG. 2 along line B-B.
Figure 4:
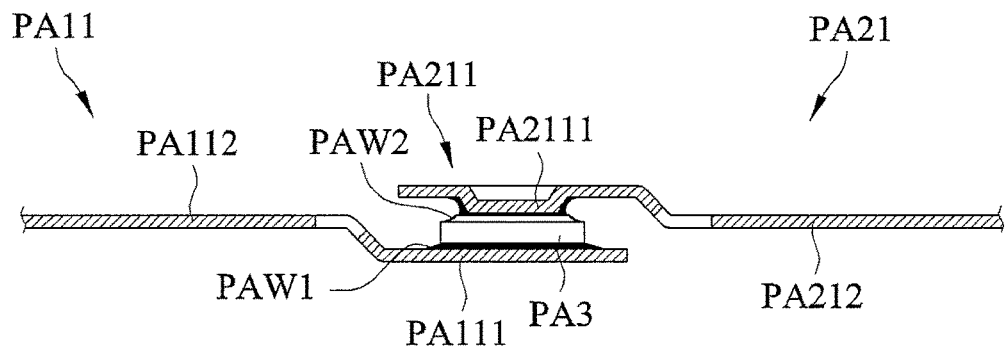
FIG. 4 is a schematic view of a die mounted by the first frame and the second frame of FIG. 3.
Figure 5:
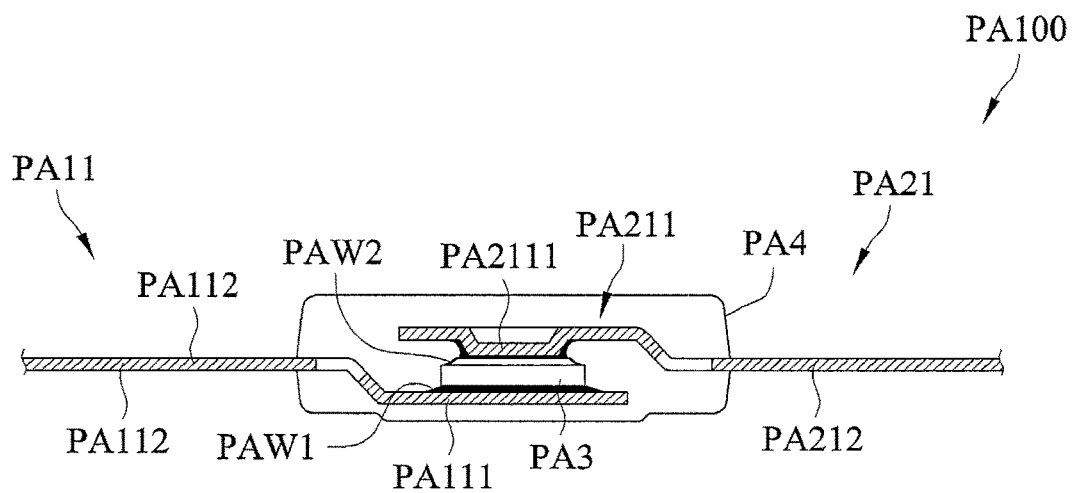
FIG. 5 shows schematically a conventional die package structure for FIG. 4.
Figure 6:
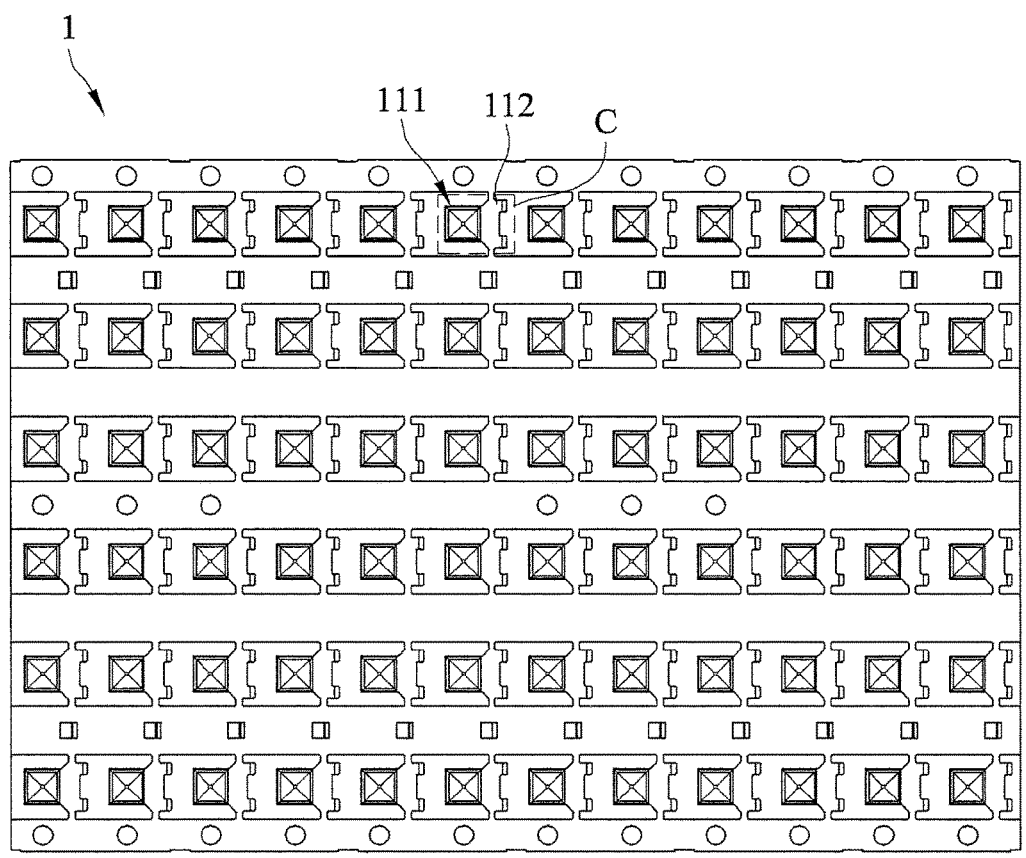
FIG. 6 is a schematic view of a preferred embodiment of the jumper assembly invention accordance with the present invention.
Figure 7:
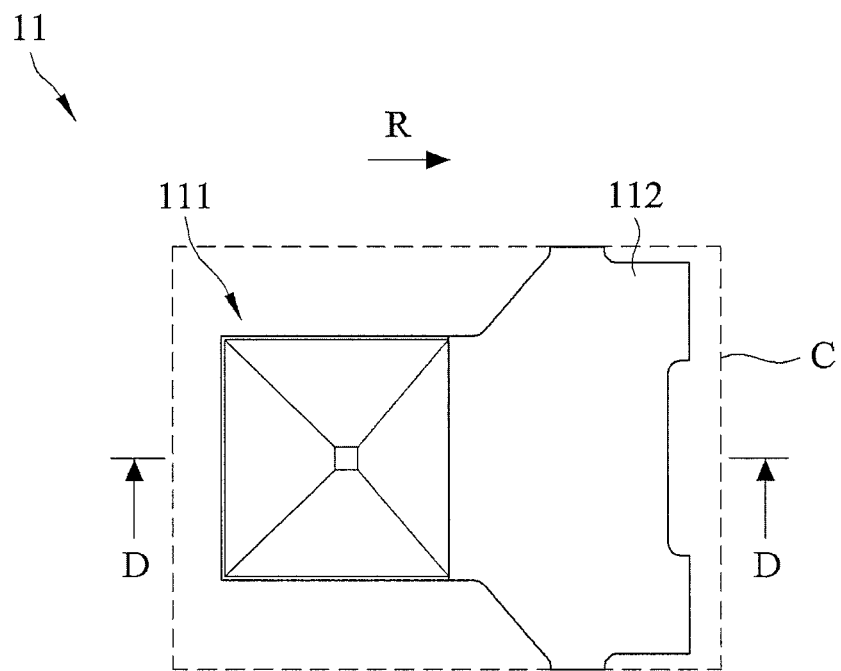
FIG. 7 is a schematic enlarged view of area C of FIG. 6.
Figure 8:
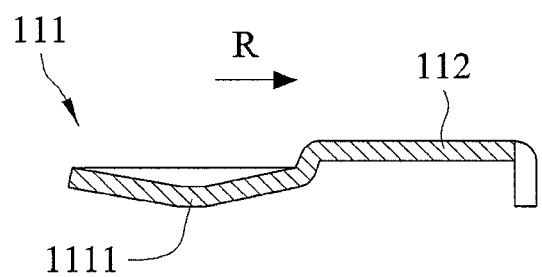
FIG. 8 is a schematic cross-sectional view of FIG. 7 along line D-D.

Referring now to FIG. 6 through FIG. 8; where FIG. 6 is a schematic view of a preferred embodiment of the jumper assembly invention accordance with the present invention, FIG. 7 is a schematic enlarged view of area C of FIG. 6, and FIG. 8 is a schematic cross-sectional view of FIG. 7 along line D-D. In producing the die package component 100, a jumper assembly 1 is firstly formed. The jumper assembly 1 includes a plurality of jumper structures 11 (one labeled in the figure) intermittently arranged into an array distribution. Each of the jumper structures 11 includes a die welding portion 111 and a lead welding portion 112. In the present invention, the jumper assembly 1 can be formed by stamping.

The die welding portion 111 has a bump structure 1111 formed by stamping the die welding portion 111. In this embodiment, the bump structure 1111 is configured to have a square platform. The lead welding portion 112 at least partly extends as a unique piece from the die welding portion 111 in an extension direction R, and has an end distant to the die welding portion 111 and bent downward.

Figure 9:
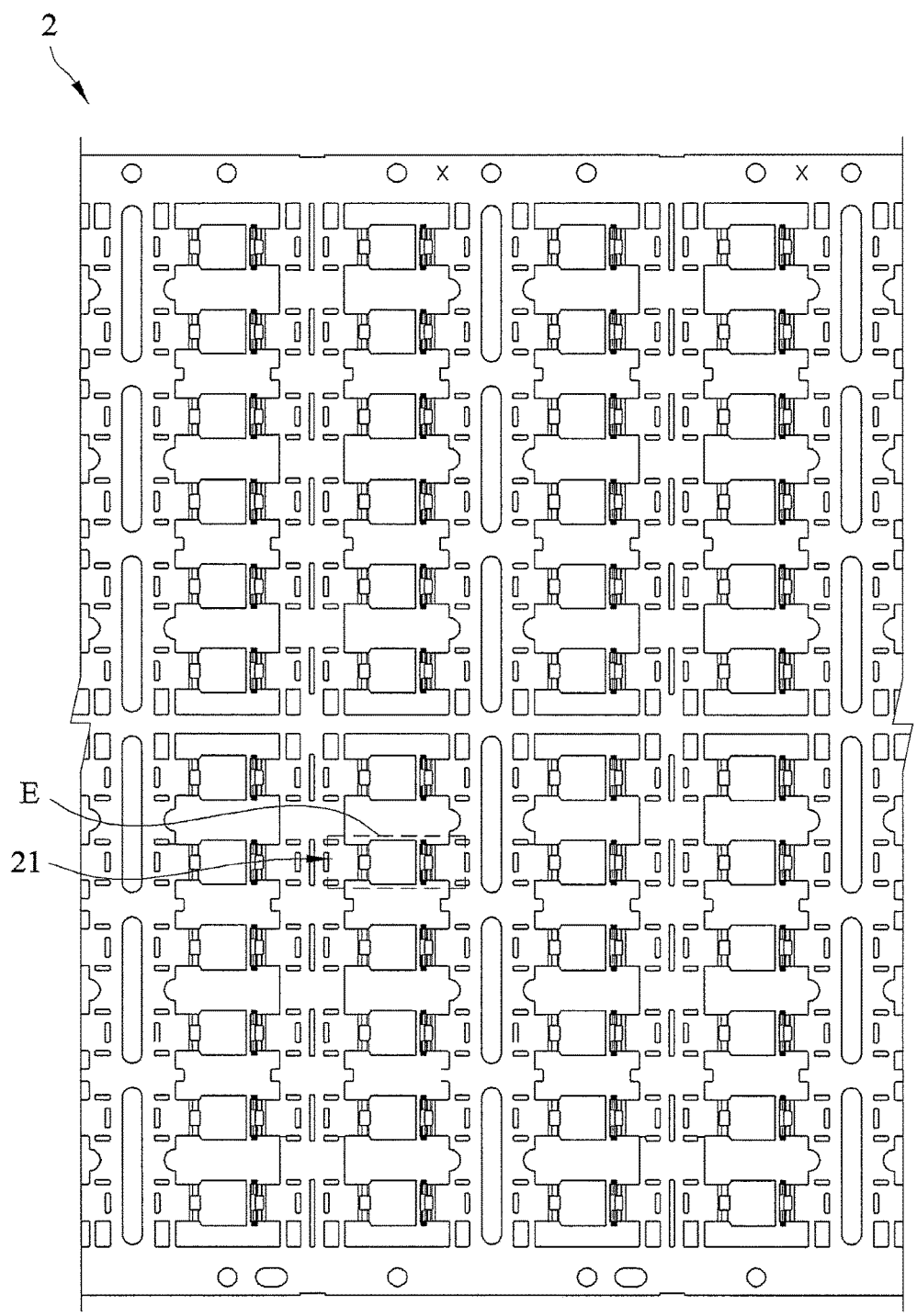
FIG. 9 is a schematic view of a preferred embodiment of the lead frame assembly invention accordance with the present invention.
Figure 10:
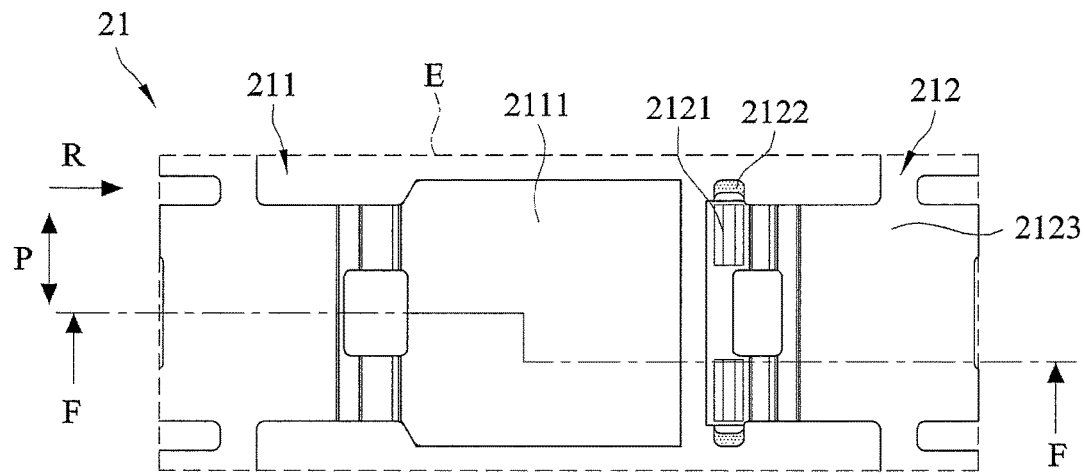
FIG. 10 is a schematic enlarged view of area E of FIG. 9.
Figure 11:
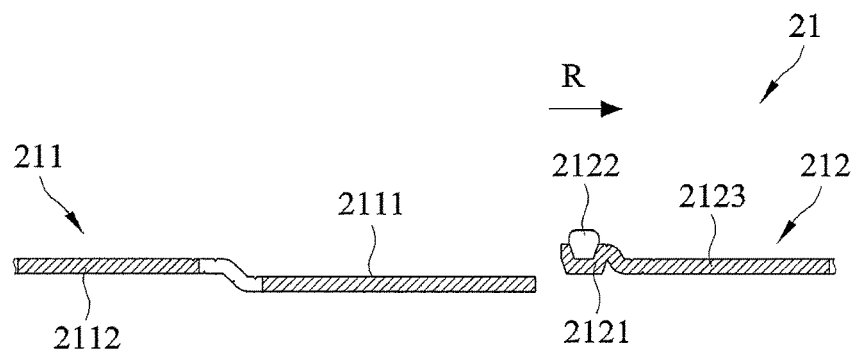
FIG. 11 is a schematic cross-sectional view of FIG. 10 along line F-F.

Referring now to FIG. 9 through FIG. 11; where FIG. 9 is a schematic view of a preferred embodiment of the lead frame assembly invention accordance with the present invention, FIG. 10 is a schematic enlarged view of area E of FIG. 9, and FIG. 11 is a schematic cross-sectional view of FIG. 10 along line F-F. As shown, the lead frame assembly 2 as a unique piece includes a plurality of lead frame components 21 (one labeled in the figure) intermittently arranged into an array distribution. Each of the lead frame component 21 includes a first lead frame 211 and a second lead frame 212. In this embodiment, the lead frame assembly 2 is made of a metal by stamping, such as, but not limited to, Cu, Ni, Ag, Au, Fe or any the like.

The first lead frame 211 has a die connection surface 2111 and a first lead 2112. The second lead frame 212 separated to the first lead frame 211 is furnished with a lead frame connection groove 2121 defining a thermal deformation tolerance allowable route M, and further includes two guide-stop structures 2122 (one labeled in the figure) and a second lead 2123. In this embodiment, the thermal deformation tolerance allowable route M can be, but not limited to, parallel to the extension direction R.

The two guide-stop structures 2122 are constructed to two opposing sides of the lead frame connection groove 2121 by extending along a vertical route P perpendicular to the extension direction R. The second lead 2123 is protruded from a place neighbored to the lead frame connection groove 2121 and extended in the extension direction R. In this embodiment, the lead frame connection groove 2121 is a trapezoidal groove, and the two guide-stop structures 2122 are two oblique constraint members. However, in some other embodiments, the configurations of the lead frame connection groove 2121 and the two guide-stop structures 2122 are not definitely complied to the aforesaid setup. It shall be noted that, at the bents of the first lead frame 211 and the second lead frame 212, pre-folding lines can be provided to guide the bending of the first lead frame 211 and the second lead frame 212.

Figure 12:
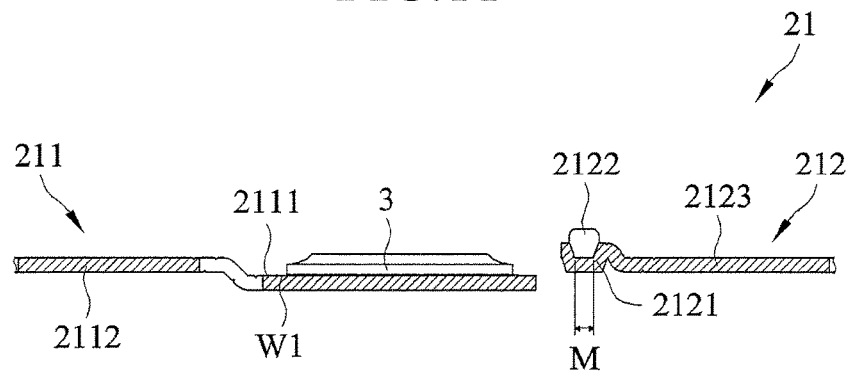
FIG. 12 demonstrates schematically a die mounted to the lead frame component of FIG. 11.

Referring now to FIG. 12, a die mounted to the lead frame component of FIG. 11 is demonstrated schematically. As shown, a sucking means is applied to displace a die 3 onto a die connection surface 2111, and then a solder W1 is applied to weld the die 3 on the die connection surface 2111. In this embodiment, the die 3 can be a general diode chip, an LED (Light-emitting diode) chip, a photodiode chip, a Schottky diode chip, a TVS (Transient-voltage-suppression) diode chip, a tunnel diode chip, a varactor diode chip or a Zener diode chip, and the solder W1 can be, but not limited to, a paste.

Figure 13:
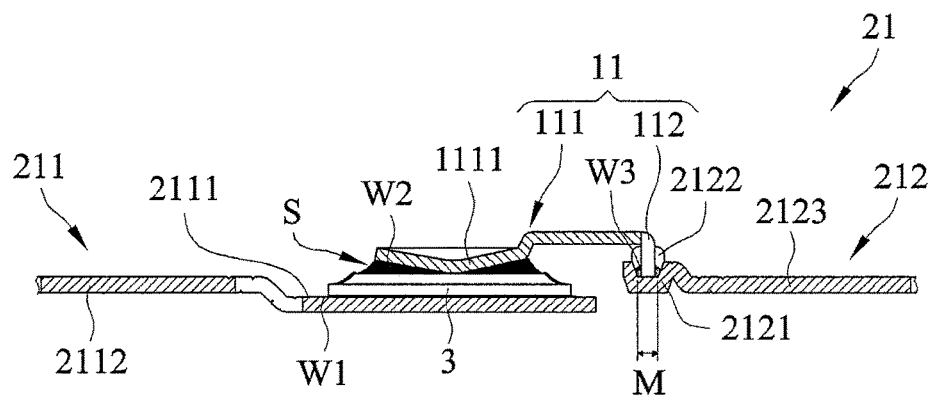
FIG. 13 shows schematically a combination of the die, the jumper structure and the lead frame component in accordance with the present invention.

Referring now to FIG. 13, a combination of the die, the jumper structure and the lead frame component in accordance with the present invention is shows schematically. The jumper structure 11 is firstly separated from the jumper assembly 1, and further the sucking means is applied to displace the jumper structure 11. Then, the solder W2 is applied to weld the bump structure 1111 of the die welding portion 111 onto the die 3, and the solder W3 is applied to weld a free end of the lead welding portion 112 onto the thermal deformation tolerance allowable route M of the lead frame connection groove 2121, in which the free end is distant to the die welding portion 111 and bent toward the lead frame connection groove 2121, such that the die 3 can be electrically coupled with the lead frame connection groove 2121.

As shown, a solder accommodation space S for accommodating the solder W2 is defined between the bump structure 1111 and the die 3. In addition, while the sucking means displaces the jumper structure 11 to the lead frame connection groove 2121, the lead welding portion 112 of the jumper structure 1 would be guided into the lead frame connection groove 2121 by the two guide-stop structures 2122 standing at the opposing sides of the lead frame connection groove 2121. In addition, as the lead welding portion 112 is located in the lead frame connection groove 2121, the lead welding portion 112 is constrained by the two guide-stop structures 2122 so as to prevent the lead welding portion 112 from leaving the lead frame connection groove 2121 along the vertical route P.

Figure 14:
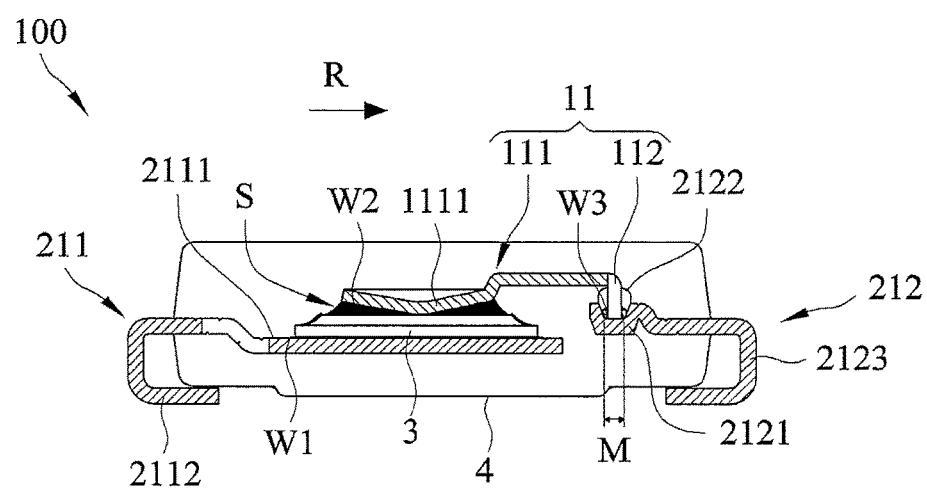
FIG. 14 shows schematically a preferred embodiment of the die package component for FIG. 13 in accordance with the present invention.
Figure 15:
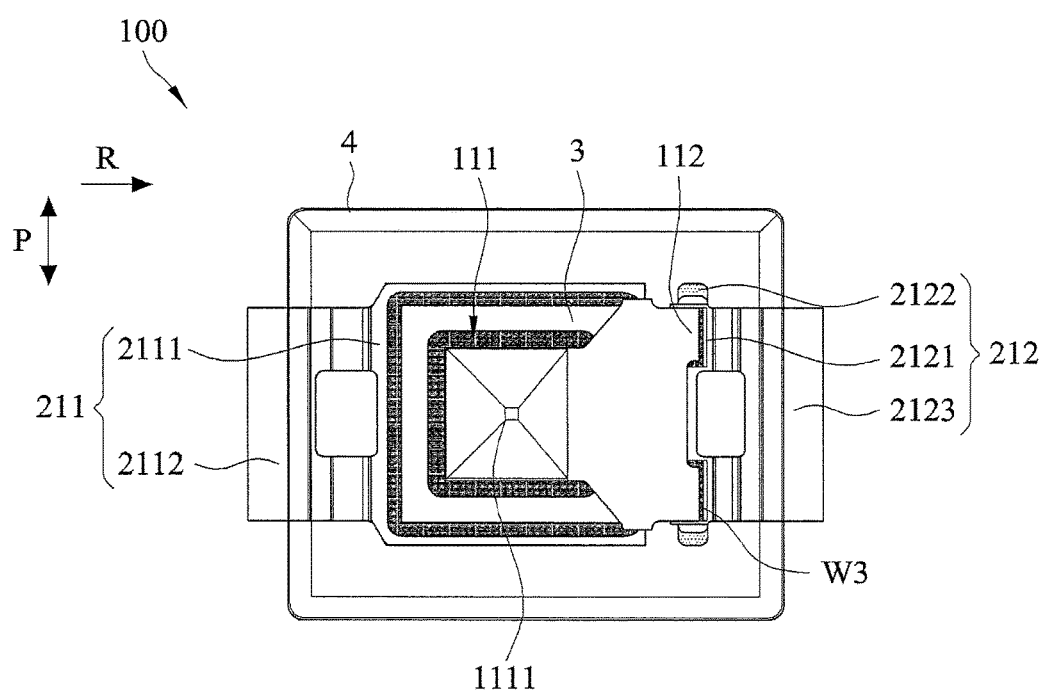
FIG. 15 is a schematic top view of FIG. 14.

Referring now to both FIG. 14 and FIG. 15; where FIG. 14 shows schematically a preferred embodiment of the die package component for FIG. 13 in accordance with the present invention, and FIG. 15 is a schematic top view of FIG. 14. As shown, the lead frame component 21 having the die 3 and the jumper structure 11 is heated to evenly distribute the solder W1 between the die connection surface 2111 and the die 3, the solder W2 in the solder accommodation space S, and the solder W3 in the lead frame connection groove 2121.

Then, a package body 4 is applied to package the jumper structure 11, the first lead frame 211, the second lead frame 212 and the die 3, with the first lead 2112 of the first lead frame 211 partly exposed out of the package body 4, and also with the second lead 2123 of the second lead frame 212 partly exposed out of the package body 4.

Finally, after the jumper structure 11, the first lead frame 211, the second lead frame 212, the die 3 and the package body 4 are cooled down, the first lead 2112 and the second lead 2123 are separated from the lead frame assembly. The exposed first lead 2112 and the exposed second lead 2123 are partly bent toward the package body 4, such that the die package component 100 with the jumper structure in accordance with the present invention is thus obtained. In this embodiment, the die package component 100 with the jumper structure is formed as, but not limited to, an SMD diode package structure.

In the present invention, as the jumper structure 11 is thermally expanded, the lead welding portion 112 would be displaced within the thermal deformation tolerance allowable route M by the induced thermal stressing. Thereupon, the jumper structure 11 would be relieved from the thermal stress caused by the thermal expansion. Thus, after the jumper structure 11 is cooled down, the die 3 can be free from damages caused by cold contraction. Namely, the risk of damages upon the die 3 caused by shearing stress would be significantly reduced.

In summary, in the die package component with the jumper structure and the manufacturing method thereof provided by the present invention, the lead welding portion is located in the lead frame connection groove having the thermal deformation tolerance allowable route and constructed at the second lead frame. While in producing the die package component with the jumper structure, the thermal-expanded lead welding portion would be displaced within the thermal deformation tolerance allowable route, such that the die won't be biased or shifted. Hence, after the jumper structure is cooled down, relative displacement between the die welding portion and the die won't be possible.

In comparison with the prior art, while in producing the die package component with the jumper structure, since the lead frame connection groove has the thermal deformation tolerance allowable route for the lead welding portion to move therewithin as the jumper structure is thermally expanded, thus the die would be free from displacement and rotation caused by the thermal-expanded jumper structure. Namely, potential damages upon the die caused by the shearing stress resulted from cold contraction of the jumper structure would be substantially reduced. Thereupon, the aforesaid low yield of the die package structure by the conventional manufacturing method thereof can be significantly improved by the present invention.

While the present invention has been particularly shown and described with reference to a preferred embodiment, it will be understood by those skilled in the art that various changes in form and detail may be without departing from the spirit and scope of the present invention.

What is claimed is:

1. A die package component with a jumper structure, comprising:
   a first lead frame, having a die connection surface;
   a second lead frame, separated to the first lead frame, furnished with a lead frame connection groove, the lead frame connection groove further including a thermal deformation tolerance allowable route, the second lead frame including a guide-stop structure at one side at least on a vertical route of the lead frame connection groove, the vertical route being perpendicular to an extension direction parallel to the thermal deformation tolerance allowable route, the guide-stop structure being to guide a lead welding portion into the lead frame connection groove and to prevent the lead welding portion from leaving the lead frame connection groove along the vertical route;
   a die, connected on the die connection surface;
   the jumper structure, generating a thermal deformation under a thermal-variable environment, further including:
   a die welding portion, welded to the die;
   a solder, located in the lead frame connection groove; and
   the lead welding portion, welded to the lead frame connection groove via the solder, being movable along the thermal deformation tolerance allowable route upon the thermal deformation; and
   a package body, at least partly packaging the first lead frame and the second lead frame, completely packaging the die and the jumper structure.

2. The die package component with a jumper structure of claim 1, wherein the lead frame connection groove is a trapezoidal groove.

3. The die package component with a jumper structure of claim 1, wherein the lead welding portion is extended from the die welding portion as a unique piece.

4. The die package component with a jumper structure of claim 3, wherein the lead welding portion is extended from the die welding portion as a unique piece and at least partly in the extension direction.

5. The die package component with a jumper structure of claim 3, wherein the die welding portion has a bump structure protruding toward the die, a solder accommodation space being formed between the bump structure and the die.

* * * * *